United States Patent [19]

Sumnitsch

[11] Patent Number: 5,492,566
[45] Date of Patent: Feb. 20, 1996

[54] SUPPORT FOR DISK-SHAPED ARTICLES USING THE BERNOULLI PRINCIPLE

[76] Inventor: Franz Sumnitsch, Universitatsstrasse 25, A-9020 Klagenfurt (Karnten), Austria

[21] Appl. No.: 194,324

[22] Filed: Feb. 8, 1994

[30] Foreign Application Priority Data

Feb. 8, 1993 [AT] Austria ........................... 221/93

[51] Int. Cl.⁶ ........................... B25B 11/00; B05C 13/00
[52] U.S. Cl. ........................... 118/500; 118/728; 269/21; 294/64.2; 156/345
[58] Field of Search ........................... 118/728, 725, 118/500; 294/64.1, 64.2; 269/20, 900, 289 R, 21; 156/345

[56] References Cited

U.S. PATENT DOCUMENTS

| | | | |
|---|---|---|---|
| 3,602,543 | 8/1971 | Einar | 294/64 R |
| 3,995,206 | 11/1976 | Aronstein | 318/593 |
| 4,029,351 | 6/1977 | Apgar et al. | 294/64 B |
| 4,257,637 | 3/1981 | Hassan et al. | 294/64 B |
| 4,445,494 | 5/1984 | Schiele et al. | 125/35 |
| 4,448,404 | 5/1984 | Ogawa | 269/21 |
| 4,559,718 | 12/1985 | Tadokoro | 34/8 |
| 4,566,726 | 1/1986 | Correnti | 294/64.3 |
| 4,903,717 | 2/1990 | Sumnitsch | 134/99 |
| 4,969,676 | 11/1990 | LaMagna | 294/64.3 |
| 5,033,538 | 7/1991 | Wagner | 165/80.1 |
| 5,370,709 | 12/1994 | Kobayashi | 29/25.01 |
| 5,421,595 | 6/1995 | Cripe | 279/3 |

FOREIGN PATENT DOCUMENTS

| | | | |
|---|---|---|---|
| 389959 | 2/1990 | Austria | 134/99 |
| 0048995 | 4/1982 | European Pat. Off. | 125/35 |
| 0176496 | 4/1986 | European Pat. Off. . | |
| 0316296 | 5/1989 | European Pat. Off. | 134/99 |
| 0444714 | 9/1991 | European Pat. Off. | 134/99 |
| 0456426 | 11/1991 | European Pat. Off. . | |
| 2566682 | 1/1986 | France . | |
| 1928203 | 2/1971 | Germany . | |
| 2431507 | 1/1976 | Germany . | |
| 3637567 | 5/1988 | Germany . | |
| 3801666 | 7/1989 | Germany . | |

Primary Examiner—R. Bruce Breneman
Assistant Examiner—Jeffrie R. Lund
Attorney, Agent, or Firm—Young & Thompson

[57] ABSTRACT

A support (1, 100) for disk-shaped articles (11), comprises an annular nozzle (8) in a circular surface (9, 10) of the support (1, 100) facing the article (11). The nozzle is fed with compressed gas for the formation of a gas cushion between the support (1) and the disk-shaped article (11). At least one projection (85, 90, 108) in the surface (9, 10) of the support (1, 100) facing the article (11) serves as a rest for the articles. The projection (85, 90, 108) is arranged within the nozzle (8) provided in the surface (9, 10) of the support (1, 100) facing the article (11), at a radial distance outward from the axis (14) of the support (1, 100) but at a distance radially inward from the nozzle (8). The support thus provides a rest for the article (11). The nozzle (8) is so shaped as to direct the gas radially outwardly in all directions from the disk-shaped article (11), thereby to draw the article against the support (1, 100) by the Bernoulli principle.

13 Claims, 2 Drawing Sheets

SUPPORT FOR DISK-SHAPED ARTICLES USING THE BERNOULLI PRINCIPLE

FIELD OF THE INVENTION

The invention relates to a support making use of the Bernoulli principle, for disk-shaped articles, especially for silicon disks during the etching thereof, with a preferably annular nozzle in the preferably circular surface of the support facing the article, this nozzle being fed with compressed gas for the formation of a gas cushion between the support and the disk-shaped article, and with at least one projection in the surface of the support facing the article as a rest for the article, wherein the projection is arranged within the nozzle provided in the surface of the support facing the article.

THE KNOWN PRIOR ART

A support of the above-described type has been known from U.S. Pat. No. 4,445,494. In this conventional support, a ball is inserted in the surface of the support facing the disk-shaped article, in the center of the support, so that the disk-shaped article is supported only in a punctiform fashion. The support known from U.S. Pat. No. 4,445,494 serves for propping up disk-shaped articles while they are sawed off from a rod and for swinging away the disk cut off from the rod and transferring the disk to a collecting device. A treatment or further processing of the disk-shaped article while held by the support is not provided for in U.S. Pat. No. 4,445,494. It is not possible, either, to set the article into rotation by means of the support of U.S. Pat. No. 4,445,494, since the ball of the support engages only in the zone of the center of the article so that no torques can be transmitted to this article.

Supports for disk-shaped articles have also been known from U.S. Pat. No. 4,903,717. These supports do not exhibit any propping means in the surface facing the disk-shaped article so-that the latter is retained on the support exclusively by Bernoulli's theorem on a gas cushion forming between the disk-shaped article and the support.

One difficulty in .these conventional supports resides in that the disk-shaped articles practically float on the gas cushion and therefore are not fixed in place toward the side. Therefore, the support known from U.S. Pat. No. 4,903,717 includes retaining cams that can be brought into contact with the rim of the disk-shaped article.

These retaining cams, however, have the drawback that they must be radially adjustable for adaptation to various diameters and that they influence, during treatment of the disk-shaped article with a treatment fluid, especially when etching silicon disks, the flow of the treatment fluid in the marginal zone so that at that location a nonuniform etching and/or treatment effect can be produced.

OBJECT OF THE INVENTION

The invention is based on the object of improving the known support, starting from U.S. Pat. No. 4,445,494, in such a way that a secure retention of disk-shaped articles is possible while they are treated with a treatment fluid, without requiring holding cams in contact with the rim of the disk-shaped article.

SUMMARY OF THE INVENTION

This object has been attained according to the invention in that the projection is provided at a radial distance from the axis of the support, but radially within the nozzle and, at that location, forms a rest for the article.

In the support of this invention, the disk-shaped article is urged against the projection by the vacuum produced based on the aerodynamic paradox (Bernoulli's principle) between the disk-shaped article and the surface of the support facing this article. Since the projection (or the projections) in this invention engages (or engage) the article (at least) outside of its center, it or they can securely retain the article during treatment (to reduce tipping), and the article can be set into rotation by turning the support since the projection or projections engages or engage at the article in eccentric fashion and thus torques can be transmitted to the article.

In one embodiment of the invention, the provision is made that the projection is a plate of ceramic or synthetic resin.

An advantageous embodiment of the invention provides that the projection is elastically resilient in a direction perpendicular to the surface of the support facing the article. In this embodiment, the projection yields elastically in the direction toward the surface of the support facing the disk-shaped article so that a state of equilibrium results, reducing deformations of the disk-shaped article as they can occur in case of a rigid projection contacting only in the center of the article in accordance with U.S. Pat. No. 4,445,494 if this projection is not correctly dimensioned. Yet, the disk-shaped article is retained by frictional connection also in the direction in parallel to the surface of the support facing the article so securely that it can be treated with a treatment fluid and, for a removal of the latter by centrifugal action, can be set into rotation by rotating the support.

An advantageous embodiment of the invention is characterized in that the projection is arranged concentrically to the axis of the support. In this way, a uniform distribution is ensured of the forces acting on the disk-shaped article held by the support.

An especially simple embodiment with an elastically resilient projection is obtained by the provision that the projection is a plate of an elastically resilient material countersunk into the surface of the support facing the article.

It is preferred within the scope of this invention for the plate to be a plate of a porous plastic or a porous ceramic. In this embodiment, the vacuum retaining the article on the support can also be formed within and/or in the zone of the projection so that the retaining force is enhanced.

In case the projection consists of a rigid material, an embodiment is preferred in this invention wherein the plate is supported with respect to the support by elastic elements. The elastic elements can be coil springs.

A practical embodiment of the invention is characterized in that the projection in the surface of the support facing the article is a ring of an elastically resilient material inserted in the surface of the support facing the article. In this embodiment, it is preferred according to the invention that the ring of elastically resilient material is inserted in a circular-ring-shaped groove in the surface of the support facing the article and/or that the ring-shaped projection consists of silicone encased in "Teflon" (polytetrafluoroethylene). Also in this embodiment the provision can be made that the ring consists of a porous synthetic resin or is hollow so that the advantageous effect is achieved as described above for porous projections.

Another embodiment of the support according to the invention is distinguished in that, in the surface of the support facing the article, several projections are arranged in a row in parallel to the outer periphery of the support, in case of a circular support in a circle. The projections can consist of an elastic material or—in case elastically resilient projections are desired—the provision can be made that each projection is mounted with respect to the support by means of an elastic element. The elastic element can be a coil spring.

BRIEF DESCRIPTION OF THE DRAWINGS

Additional details and features of the invention can be derived from the following description of the embodiments of supports according to this invention illustrated in the drawings wherein.

DETAILED DESCRIPTION OF THE INVENTION

Figure 1:
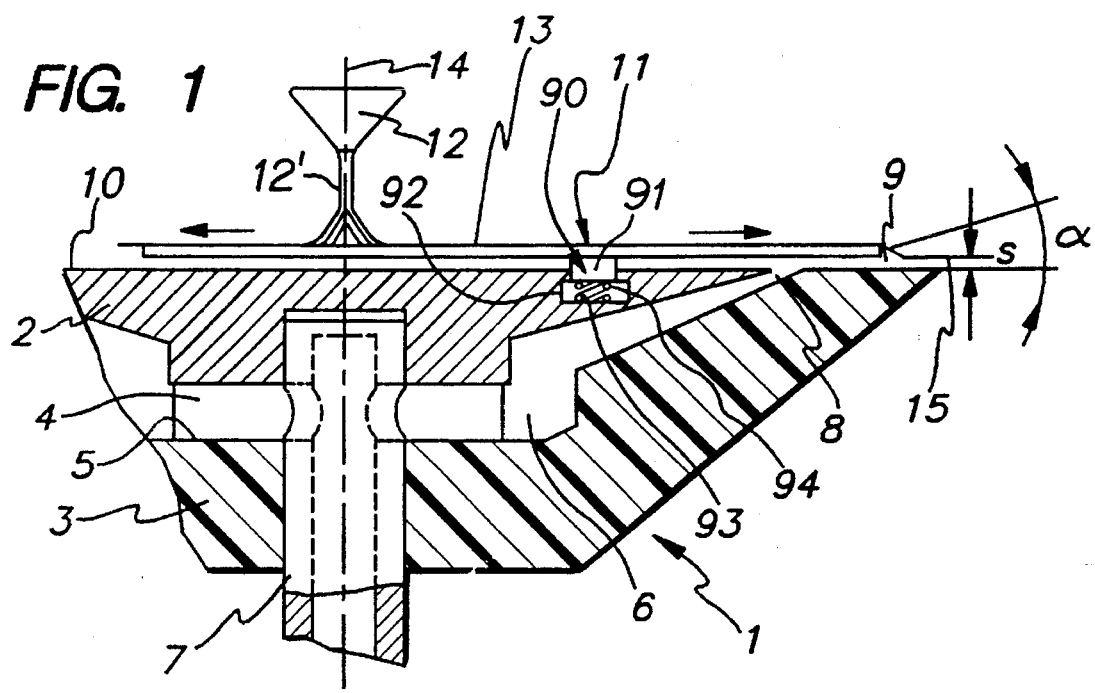
FIG. 1 shows a first embodiment in an axial sectional view.

A support 1 shown in FIG. 1 is of a rotationally symmetrical design and consists of an inner part 2 preferably made of a metal and an outer, approximately cup-shaped part 3 consisting preferably of a synthetic resin. The inner part 2 is seated with an extension 4 on an upwardly oriented surface 5 of the outer part 3 so that the relative position of parts 2 and 3 with respect to each other is defined.

Between the two parts 2 and 3 of the support 1, a space 6 is provided into which gas under pressure, such as, for example, air or nitrogen, can be introduced by way of a quill shaft 7. The space 6 terminates into an annular nozzle 8, the boundary walls of the latter, formed by parts 2 and 3, forming an acute angle α with the upper surface of the support 1.

In all disclosed embodiments, several nozzles arranged, for example, about a circle concentric to the axis 14 of the support can be provided in place of the nozzle 8 in the form of an annular slot. These nozzles can be round exit openings or slot-like exit openings which can be curved along a circular arc.

The upper end surface of the support 1 is constituted by an annular surface 9 of part 3 and a circular surface 10 of part 2. Between the annular surface 9 and the circular surface 10, the annular nozzle 8 terminates in the end face of the support 1.

A disk-shaped article 11 is maintained at a spacing S from the facing surface of the support 1 (annular surface 9 and circular surface 10) by the gas fed via the quill shaft 7 and exiting from the nozzle 8. On account of the special structure of the annular nozzle 8, a vacuum results (Bernoulli's theorem) during efflux of the gas between the surface 9, 10 of the support 1 facing the article 11 and the article 11 proper; by this vacuum, the disk-shaped article 11 is held down and is not blown away by the gas flowing out of the annular nozzle 8. In this embodiment of the support 1 according to the invention, the advantage is obtained that the distance S is largely independent of the pressure of the gas introduced into the space 6 and flowing out of the ring nozzle 8.

FIG. 1 shows that a conduit 12 terminates above the diskshaped article 11 through which a treatment fluid 12', e.g. an acid for etching a silicon disk, can be fed to the upper surface of the disk-shaped article 11. It is also shown in FIG. 1 that the treatment fluid applied to the disk-shaped article 11 forms a liquid film 13 on the topside of the article, the thickness and uniformity of this film over the entire surface area depending on the amount of treatment fluid applied and on the speed of revolution of the support 1 about its axis 14. The film 13 of treatment fluid will fly off from the outer edge of the disk-shaped article 11 as shown by the arrows in FIG. 1. The thus-produced droplets 15 are blown away by the gas exiting from the ring nozzle 8, as indicated in FIG. 1, so that treatment fluid does not pass to the bottom side of the disk-shaped article 11.

In the surface 10 of part 2, projections 90 are provided which are arranged about a circle concentric to the axis 14 of the support 1. The projections 90 are formed by cylindrical members 91 received in blind holes 92 in part 2 of the support 1 slidably in a direction parallel to the axis 14. A coil spring 94 is provided between the bottom 93 of each blind hole 92 and the end face of the cylindrical member 91 facing the support 1; this spring urges the cylindrical member 91 in FIG. 1 in the upward direction, i.e. toward the disk-shaped article 11.

In order to prevent the cylindrical members 91 from leaving the blind holes 92 entirely without this being desired, the cylindrical members 91 can be connected, for example, with the coil springs 94 and the latter, in turn, with the bottom 93 of the blind holes 90.

Figure 3:
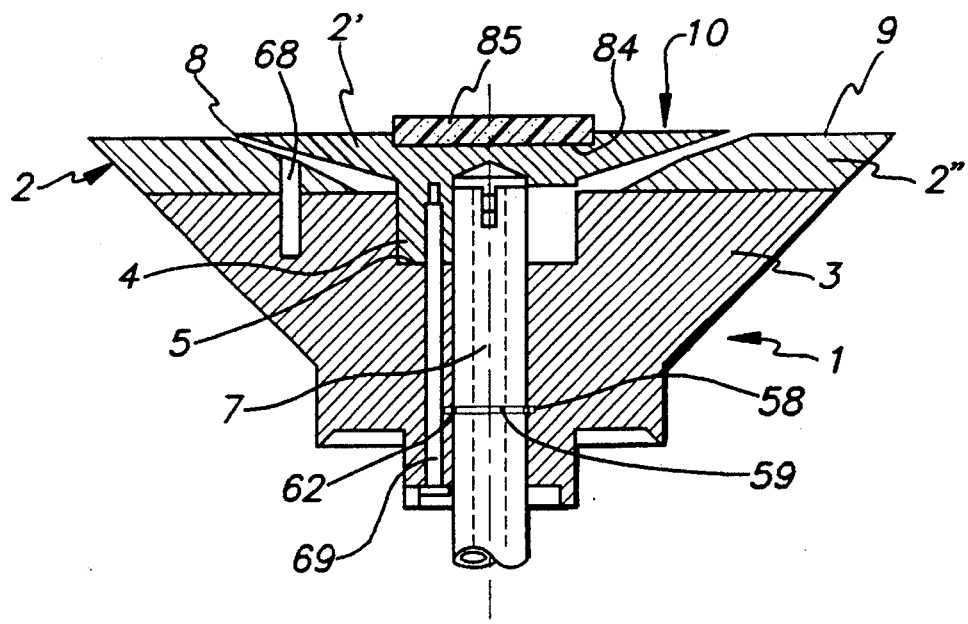
FIG. 3 shows a further embodiment of a support in an axial sectional view.

In the embodiment illustrated in FIG. 3, the part 2 of the support 1 is composed of a part 2" and a part 2'. Part 2' forms the circular surface 10, and part 2" forms the annular surface 9. The ring nozzle 8 is constituted by the mutually facing surfaces of part 2" and part 2'.

Part 2" is attached to the outer part 3 by fitting pin 68 and a snap connection not illustrated in detail.

Part 2' is seated with an extension 4 on an upwardly oriented surface 5 of part 3. Part 2' and the outer part 3 are firmly joined together by screw 69. By the insertion of shims between the extension 4 and the surface 5 of the outer part 3, the relative position of part 2' with respect to the outer part 3 can be varied in the axial direction so that the width of the ring nozzle 8 can be adjusted to the desired size.

For fixing the hollow shaft 7 in position in the axial direction within the outer part 3, an annular groove 59 is provided in the shaft 7, and an annular groove 58 is located in the bore for the shaft 7 in the outer part 3, these grooves lying in mutual opposition. Furthermore, two mutually parallel bores extending through the part 3 are provided in the outer part 3, these bores lying on both sides of the shaft 7, contacting the shaft 7 with their central axes, and extending through the annular grooves 58 and 59. Spring steel pins 62 are inserted in the bores and project through the annular grooves 58, 59 and thus retain the quill shaft 7 in the outer part 3 in the axial direction.

A plate 85 having, for example, a circular shape and made of a porous synthetic resin (e.g. polyvinylidene fluoride) is inserted in a depression 84 in the upper end surface 10 of part 2', i.e. the surface facing the disk-shaped article 11 to be retained at the support 1. This plate 85 of a porous plastic is elastically resilient at least in the direction of the axis 14 so that, when holding an article 11 on the support 1, it is elastically deformed under the effect of the vacuum produced between the support 1 and the side of the disk-shaped article 11 facing the support; in other words, the plate is somewhat elastically compressed. An embodiment is also possible having a plate 85 of a rigid plastic or of ceramic which is preferably porous.

Figure 2:
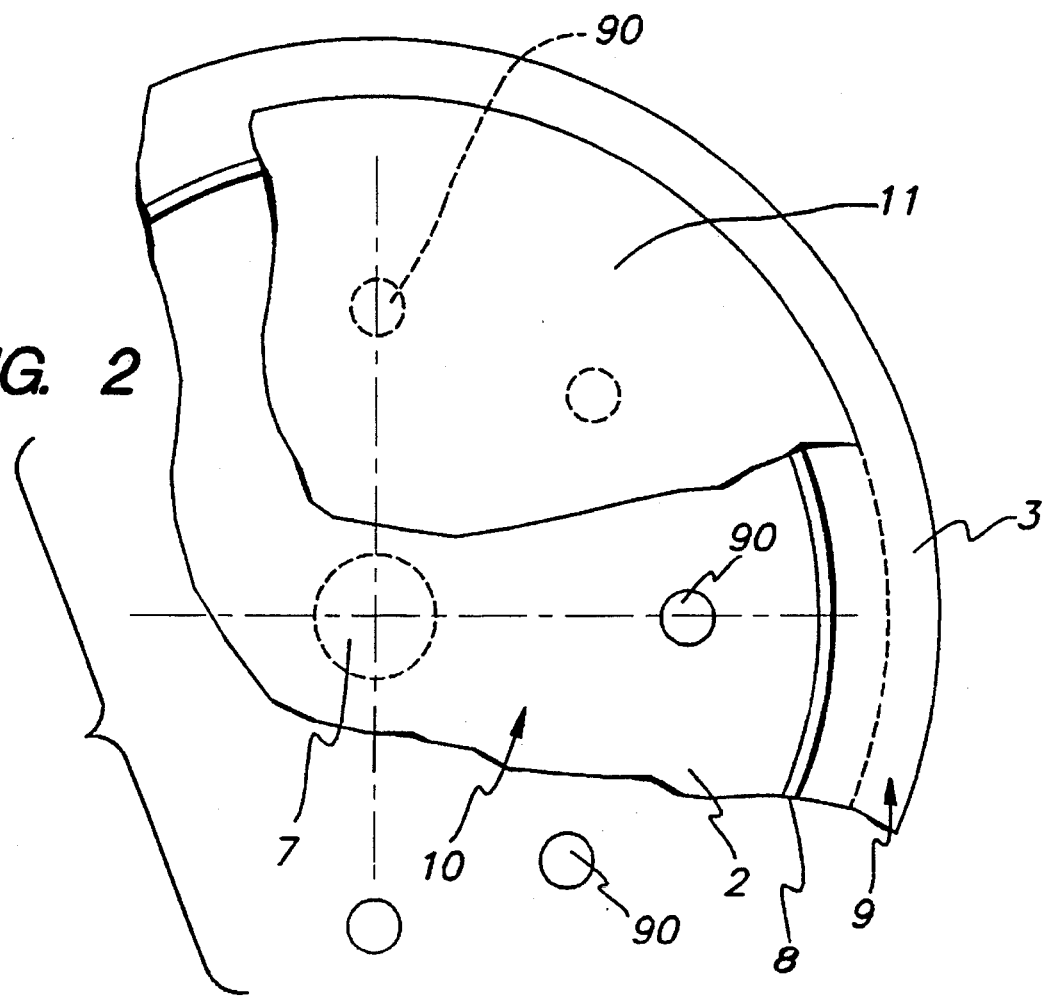
FIG. 2 shows a top view of the embodiment of FIG. 1.

It should furthermore be noted that the plate 85 constituting the projection can also be elastically supported on its side facing the support by elastic means, for example several coil springs, in a similar manner as the cylindrical members 91 of the embodiment of FIGS. 1 and 2, i.e. the plate need not be in direct contact with the bottom of the flat recess 84 in part 2' of the support 1 according to FIG. 3.

Figure 4:
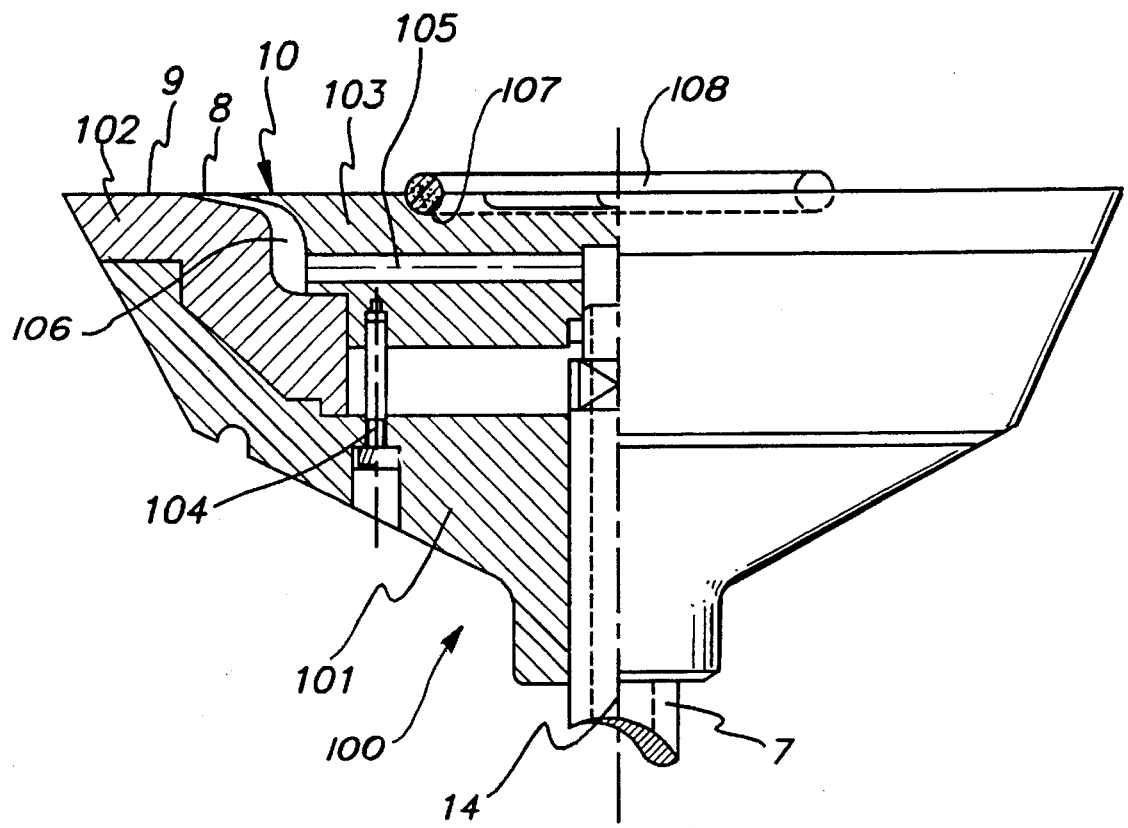
FIG. 4 shows a fourth embodiment, likewise in an axial sectional view.

In the embodiment illustrated in FIG. 4, the support 100 proper likewise consists of several rotationally symmetrical parts, namely a lower cup-shaped part 101, an annular part 102, and a plate-shaped, round part 103 fixedly mounted on the cup-shaped part 101 with the aid of screws 104, thereby also fixedly mounting the annular part 102. Between the annular part 102 and the round, plate-shaped part 103, the annular nozzle 8 for the efflux of gas is provided, this gas being supplied via the hollow shaft 7 and several radial bores 105 into a space 106 formed between the annular part 102 and the round, plate-shaped part 103.

In the surface 10 of the circular, plate-shaped part 103 facing the article 11 (not shown in FIG. 4), a circular groove 107 is provided which is approximately semicircular in cross section. A ring 108 is inserted in this groove 107; the ring consists, for example, of silicone and thus is elastically resilient. The ring 108 of silicone can be coated with "Teflon" (polytetrafluoroethylene) on its outer surface. The ring 108 can be a ring 108 of solid material, or it can consist of a porous material, for example the material mentioned hereinabove for the plate 85, or it can be a hollow ring. In one embodiment, the ring 108 is elastic in the direction of the axis 14.

The ring 108 is elastically compressed in a similar way as the elastic member 85 of the embodiment of FIG. 3 under the effect of the vacuum between the disk-shaped article 11 and the surface of the support 100 facing this article so that the disk-shaped article 11 is securely retained on the support 100 and cannot move laterally, either.

In case the projection (especially the plate or the ring) of the support according to the invention consists of a porous material, then the advantage is obtained when operating the device that the vacuum formed, based on the Bernoulli principle, is also produced in the region where the disk-shaped article is in contact with the projection so that the retention of the article on the support is still further enhanced.

In summation, the invention of FIG. 4 can be stated, for example, as follows:

In a support 100 for a disk-shaped article, a nozzle 8 is provided in the surface 9, 10, facing the disk-shaped article, gas exiting from this nozzle and holding the disk-shaped article by means of the vacuum produced based on the Bernoulli principle against a circular-ringshaped projection 108 provided in the surface 10.facing the article. The projection 108 is elastically resilient in the direction of the axis 14 of the support 100, i.e. perpendicularly to the surface 10 of the support 100 facing the article, so that the article is securely held on the support 100 against displacement in a direction parallel to the surface 10, without there being any need for providing lateral props, such as cams or the like. Due to the fact that lateral props are dispensable, such props do not impede, either, the efflux of treatment fluid from the rim of the article retained on the support 100.

What is claimed is:

1. A support (1, 100) for disk-shaped articles (11), comprising an annular nozzle (8) in a circular surface (9, 10) of the support (1, 100) facing the article (11), means for feeding said nozzle with compressed gas for the formation of a gas cushion between the support (1) and the disk-shaped article (11), and at least one projection (85, 90, 108) in the surface (9, 10) of the support (1, 100) facing the article (11) as a rest for the article, wherein the projection (85, 90, 108) is arranged within the nozzle (8) provided in the surface (9, 10) of the support (1, 100) facing the article (11), the projection (85, 90, 108) being provided at a radial distance outward from the axis (14) of the support (1, 100) but at a distance radially inward from the nozzle (8) and providing a rest for the article (11), the nozzle (8) being so shaped as to direct said gas radially outwardly in all directions from the disk-shaped article (11), thereby to draw the article against the support (1, 100) by the Bernoulli principle, the projection (85, 90, 108) being elastically resilient in a direction perpendicular to the surface (9, 10) of the support (1, 100) facing the article (11).

2. Support according to claim 1, wherein the projection is a plate of ceramic or synthetic resin.

3. Support according to claim 1, wherein the projection is arranged concentrically to the axis (14) of the support (1, 100).

4. Support according to claim 1, wherein the projection (85) is a plate (85) of an elastically resilient material countersunk into the surface (9, 10) of the support (1) facing the article (11).

5. Support according to claim 4, wherein the plate (85) is porous.

6. Support according to claim 1, wherein the projection is supported by a coil spring (94).

7. Support according to claim 1, wherein the projection in the surface (9, 10) of the support (100) facing the article (11)is a ring (108) of an elastically resilient material inserted in the surface (9, 10) of the support (100) facing the article (11).

8. Support according to claim 7, wherein the ring (108) of elastically resilient material is inserted in a circular-ring-shaped groove (107) in the surface (10) of the support (100) facing the article (11).

9. Support according to claim 7, wherein the annular projection (108) consists of silicone encased with "polytetrafluoroethylene".

10. Support according to claim 7, wherein the ring (108) consists of a porous synthetic resin or is hollow.

11. Support according to claim 1, wherein, in the surface (10) of the support (1) facing the article (11), several projections (90) are arranged in a circle.

12. Support according to claim 11, wherein each projection (90) is supported with respect to the support (1) by an elastic element (94).

13. Support according to claim 12, wherein the elastic element is a coil spring (94).

* * * * *